(12) United States Patent
Lunt et al.

(10) Patent No.: US 10,439,090 B2
(45) Date of Patent: Oct. 8, 2019

(54) TRANSPARENT LUMINESCENT SOLAR CONCENTRATORS FOR INTEGRATED SOLAR WINDOWS

(71) Applicant: Board of Trustees of Michigan State University, East Lansing, MI (US)

(72) Inventors: Richard R. Lunt, Williamston, MI (US); Yimu Zhao, East Lansing, MI (US)

(73) Assignee: Board of Trustees of Michigan State University, East Lansing, MI (US)

(*) Notice: Subject to any disclaimer, the term of this patent is extended or adjusted under 35 U.S.C. 154(b) by 848 days.

(21) Appl. No.: 14/075,498

(22) Filed: Nov. 8, 2013

(65) Prior Publication Data

US 2014/0130864 A1     May 15, 2014

Related U.S. Application Data

(60) Provisional application No. 61/724,508, filed on Nov. 9, 2012, provisional application No. 61/774,054, filed on Mar. 7, 2013.

(51) Int. Cl.
| | |
|---|---|
| *H01L 31/0232* | (2014.01) |
| *H01L 31/055* | (2014.01) |
| *E06B 3/66* | (2006.01) |
| *G02B 6/10* | (2006.01) |
| *E06B 9/24* | (2006.01) |

(52) U.S. Cl.
CPC .............. *H01L 31/055* (2013.01); *E06B 3/66* (2013.01); *E06B 9/24* (2013.01); *G02B 6/102* (2013.01); *E06B 2009/247* (2013.01); *E06B 2009/2476* (2013.01); *Y02E 10/52* (2013.01)

(58) Field of Classification Search
CPC .............. H01L 31/055; H01L 31/0488; H01L 31/02322; E06B 2009/247; E06B 2009/2476
See application file for complete search history.

(56) References Cited

U.S. PATENT DOCUMENTS

| | | | |
|---|---|---|---|
| 4,155,371 | A | 5/1979 | Wohlmut et al. |
| 4,159,212 | A | 6/1979 | Yerkes |
| 4,357,486 | A | 11/1982 | Blieden et al. |

(Continued)

FOREIGN PATENT DOCUMENTS

| | | | | |
|---|---|---|---|---|
| WO | WO2012061724 | * | 5/2012 | ............... C08J 5/18 |
| WO | WO2013/003890 | | 6/2012 | |

OTHER PUBLICATIONS

Szczepura et al, Synthesis and study of hexanuclear molybdenum clusters containing thiolate ligands, Jul. 2008.*

(Continued)

*Primary Examiner* — Magali P Slawski
(74) *Attorney, Agent, or Firm* — Harness, Dickey & Pierce, PLC

(57) ABSTRACT

A transparent luminescent solar concentrator is provided. In another aspect, a luminescent solar concentrator absorbs outside of visible light and emits outside of visible light. A further aspect of a luminescent solar concentrator employs nanocrystal clusters embedded in a polymeric matrix. In still another aspect, a unique ligand and luminophore host pairing is used for a solar concentrator.

18 Claims, 12 Drawing Sheets

(56) References Cited

U.S. PATENT DOCUMENTS

| | | | | |
|---|---|---|---|---|
| 4,994,396 | A | * | 2/1991 | Lefkowitz ............ G01N 21/643 250/459.1 |
| 5,877,874 | A | * | 3/1999 | Rosenberg ................ F24J 2/06 136/246 |
| 6,238,931 | B1 | * | 5/2001 | Buechler ................ C09B 47/08 435/6.11 |
| 2009/0027872 | A1 | * | 1/2009 | Debije .................. G02B 6/001 362/84 |
| 2009/0032083 | A1 | * | 2/2009 | Torrance .......... H01L 31/02322 136/246 |
| 2009/0229652 | A1 | * | 9/2009 | Mapel .................. H01L 31/055 136/246 |
| 2010/0276638 | A1 | * | 11/2010 | Liu ........................ B82Y 30/00 252/301.35 |
| 2010/0288352 | A1 | | 11/2010 | Ji et al. |
| 2011/0108773 | A1 | * | 5/2011 | Gore ........................ B22F 9/24 252/501.1 |
| 2011/0240120 | A1 | * | 10/2011 | Ronda .................. H01L 31/055 136/257 |
| 2014/0283896 | A1 | * | 9/2014 | Lunt, III .............. H01L 31/055 136/247 |
| 2018/0243442 | A1 | * | 8/2018 | Lam ..................... A61K 9/0019 |

OTHER PUBLICATIONS

Watt's Dictionary of Chemistry, vol. 3, p. 428 (1892).*

Osborn et al, Jun. 2005 "Mo6Cl12—incorporated sol-gel for oxygen sensing applications".*

Zietlow et al. "Photophysics and Electrochemistry of Hexanuclear Tungsten Halide Clusters" Inorg. Chem. 1986, 25, 1351-1353 (Year: 1986).*

Landsman et al. "Light-absorbing properties, stability, and spectral stabilization of indocyanine green" Journal of Applied Physiology, vol. 40, No. 4, Apr. 1976 (Year: 1976).*

Brabec, C.J. et al., "Organic photovoltaic devices produced from conjugated polymer/ methanofullerene bulk heterojunctions." Synthetic Metals, vol. 121, No. 1-3, pp. 1517-1520 (2001).

Chen, Chun-Chao et al., "Visibly Transparent Polymer Solar Cells Produced by Solution Processing." ACS Nano, vol. 6, No. 8, pp. 7185-7190 (2012).

Faist, Mark A., "Competition between the charge transfer state and the singlet states of donor or acceptor limiting the efficiency in polymer:fullerene solar cells." Journal of the American Chemical Society, vol. 134, No. 1, pp. 685-692 (2012).

Galluzzi, F. et al., "Spectrum Shifting of Sunlight by Luminescent Sheets: Performance Evaluation of Photovoltaic Applications." Solar Energy, vol. 33, No. 6, pp. 501-507 (1984).

Kirakci, Kaplan et al., "A Highly Luminescent Hexanuclear Molybdenum Cluster—A Promising Candidate toward Photoactive Materials." European Journal of Inorganic Chemistry, pp. 3107-3111 (2012).

Kirchartz, Thomas et al., "Efficiency Limits of Organic Bulk Heterojunction Solar Cells." The Journal of Physical Chemistry C, vol. 113, No. 41, pp. 17958-17966 (2009).

Lunt, Richard R. et al., "Theoretical limits for visibly transparent photovoltaics." Applied Physics Letters, vol. 101, pp. 043902-043902-4 (2012).

Lunt, Richard R. et al., "Transparent, near-infrared organic photovoltaic solar cells for window and energy-scavenging applications." Applied Physics Letters, vol. 98, 113305 (2011).

Reisfeld, Renata et al., "Planar solar energy convertor and concentrator based on uranyl-doped glass." Nature, vol. 274, No. 5667, pp. 144-145 (1978).

Shaheen, Sean E. et al., "2.5% efficient organic plastic solar cells." Applied Physics Letters, vol. 78, No. 6, pp. 841-843 (2001).

Slooff, L.H. et al., "A luminescent solar concentrator with 7.1% power conversion efficiency." Physica Status Solidi—Rapid Research Letters, vol. 2, No. 6, pp. 257-259 (2008).

Smestad, Greg et al., "Testing of dye sensitized $TiO_2$ solar cells I: Experimental photocurrent output and conversion efficiencies." Solar Energy Materials and Solar Cells, vol. 32, No. 3, pp. 259-272 (1994).

Vandewal, Koen et al., "On the origin of the open-circuit voltage of polymer-fullerene solar cells." Nature Materials, vol. 8, No. 11, pp. 904-909 (2009).

Yoon, Jongseung et al., "Flexible concentrator photovoltaics based on microscale silicon solar cells embedded in luminescent waveguides." Nature Communications, vol. 2, No. 243 (2011).

* cited by examiner

TRANSPARENT LUMINESCENT SOLAR CONCENTRATORS FOR INTEGRATED SOLAR WINDOWS

CROSS-REFERENCE TO RELATED APPLICATIONS

This application claims priority to U.S. Provisional Ser. Application Nos. 61/724,508 filed on Nov. 9, 2012, and 61/774,054 filed on Mar. 7, 2013, which are each incorporated by reference in their entirety herein.

BACKGROUND

The present application generally pertains to luminescent solar concentrators and more particularly to transparent luminescent solar concentrators for integrated solar windows.

Integrating solar-harvesting systems into the built environment is a transformative route to capture large areas of solar energy, lower effective solar cell installation costs, and improve building efficiency. Widespread adoption of solar-harvesting systems in a building envelope, however, is severely hampered by difficulties associated with mounting traditional solar modules on and around buildings due to cost, architectural impedance, and mostly importantly, aesthetics.

The concept of luminescent solar concentrators ("LSCs") is well known, and with recent advances in phosphorescent and fluorescent luminophore efficiencies, LSC system efficiencies have increased to 7.1%. Although optical funneling of light limits the overall system conversion efficacy to less than ten percent (without LSC stacking), it can dramatically reduce the area of expensive solar cells needed, driving down the overall installed cost and increasing the ratio of electricity generation to solar cell surface area. Because of the high cost of glass and real-estate that factor into the module and the balance of systems costs, respectively, such LSCs have rarely been adopted in solar-farm practice despite the increasing performance and potential for low module costs. Furthermore, there has been demonstrated interest in utilizing LSCs as architectural windows. To date, however, these systems have been limited to absorption and emission (glow) in the visible part of spectrum, hindering widespread adoption of such devices in windows. In general, the purpose of windows is to provide natural lighting with a view; that is, most people prefer not to work behind strongly colored glass. A high level of untinted-transparency is therefore desirable for ubiquitous adoption.

The performance of LSCs can be understood by the component efficiencies: luminophore photoluminescence efficiency, solar spectrum absorption efficiency, waveguide (trapping) efficiency, solar cell efficiency, and transport (re-absorption) efficiency. The processes are schematically highlighted in FIG. 1 with a summary of the highest achieving systems to date with their corresponding dimensions in Table 1. The highest performance LSCs utilize phosphorescent organic molecules or blends of multiple fluorophores (such as quantum dots or organic dyes) that act to reduce reabsorption (Stokes shift) losses and enhance overall absorption efficiencies across the spectrum. The highest efficiencies reported (6-7%) have been for relatively small plates (<0.1 $m^2$), since larger LSCs sizes suffer substantial reabsorption losses that limit efficiencies to <5%. A summary of key aspects of each loss mechanism is described below:

TABLE 1

Highest preforming LSC demonstrations with corresponding area dimensions:

| Chromophore | Cell | LSC Size (m x m) | t (mm) | Effic. (%) | Visibly Colored | Ref |
|---|---|---|---|---|---|---|
| DCM | Si | 1.2 x 1 | 4 | 1.3 | Yes | 5 |
| Coumarin | Si | 1.2 x 2 | 4 | 2.3 | Yes | 5 |
| Coumarin, Rhodamine | Si | 1.4 x 1.4 | 30 | 3.2 | Yes | 6 |
| Eu(TTA)$_3$(TPPO)$_2$ | Si | 0.9 x 0.9 | 3 | 0.11 | No | 7 |
| CdSe/CdS | GaAs | 1.4 x 1.4 | 30 | 4.5 | Yes | 6 |
| CdSe/CdS | Si | 0.05 x 0.05 | 3 | 2.1 | Yes | 8 |
| Red305, CRS040 | GaAs | 0.05 x 0.05 | 5 | 7.1 | Yes | 9 |
| BA241, BA856 | GaInP | 0.02 x 0.02 | 3 | 6.7 | Yes | 10 |
| Pt(TPBP) | CdTe | 0.1 x 0.1 | 1 | 4.1 | Yes | 11 |
| Rubrene, DCJTB | CdTe | 0.1 x 0.1 | 1 | 4.7 | Yes | 11 |
| DCJTB, Pt(TPBP) Tand. | CdTe | 0.1 x 0.1 | 1 | 6.1 | Yes | 11 |

Absorption Efficiency:

For LSCs with down-converting luminophore dyes, the absorption efficiency is necessarily lower than the absorption efficiency of the attached PV. For reference, Si solar cells have 50.3% absorption efficiency for the solar spectrum, shown in FIG. 2. Integrating the solar photon flux there is approximately 5.0% in the UV (300-435 nm), 21.5% in the visible ("VIS") (435-670 nm), and 73.5% in the NIR (670-3000 nm).

PV Losses:

PV losses stem from the intrinsic thermodynamically-limited shape of the current-voltage curve. As the solar cell band gap decreases, voltage and fill-factor losses increase. Characteristic PV efficiencies illuminated by AM1.5G are shown in FIG. 3. Due to the monochromatic emission nature of the LSC, only single junction PVs can be considered around each individual LSC, defining the upper bound for the solar cell efficiency, $\eta_{PV}$, to that of the single-junction defined by Shockley-Quiesser.

Waveguide Efficiency:

Waveguiding relies on the principal of total internal reflection around a critical emission cone that results from the index variation between the waveguide and the waveguide cladding, in otherwords, air. Waveguide losses are typically 20% for waveguide substrates with an index of 1.5-1.7. Waveguide smoothness and optical transparency also play an important role as waveguides are scaled to >$m^2$ areas.

PL Efficiency:

Typical quantum yields ("QY") for down-converting chromophores now readily reach values greater than 50% for a variety of materials including organic phosphors, organic fluorophores, and colloidal quantum dots. Up-converters or anti-Stokes materials still have notably low luminescent efficiencies <5%, and typically, the quantum yields of these materials are notably limited at <1-2% QY.

Reabsorption Losses:

Light emitted by the luminophore in the waveguide must traverse the length of the waveguide before being reabsorbed by the dye or waveguide to reach the solar cell and produce power. These losses are dependent on the quantum yield of the dye, the overlap (or Stokes shift) of the dye emission-absorption, and the overall waveguide dimensions. It has been shown theoretically, that low QY massive Stoke-shift materials can outperform fluorophores with unity quantum yields over large LSC dimensions. That is, even for luminophores with 100% quantum yield, reabsorption losses can become dominant for luminophores with small Stokes-shift in large waveguides since each absorption/emission event leads to a reduction of photon flux through cone emission from the front of the waveguide that effectively act as scattering events.

It has long been recognized that LSCs are most limited by reabsorption losses, particularly for larger plate sizes. Indeed, much of the research with LSCs has focused on the reduction of these reabsorption losses through increasing Stokes shifts with organic phosphors, multiple dye optimization to artificially increase the Stokes-shift or resonance shifting, applicable only to neat-film dye layers less than several microns thick.

Previous efforts to construct transparent solar-harvesting architectures have focused on: (1) semi-transparent thin-film photovoltaics that typically have severe tinting or limited transmission or have an inherent tradeoff between efficiency and transparency, (2) LSCs incorporating colored chromophores that absorb or emit in the visible, or (3) optical systems using wavelength dependent optics that collect direct light only and reguire solar tracking. All of these approaches are severely limited in their potential for window applications due to aesthetic properties, bulkiness, or considerably limited transparency. These approaches suffer from an inherent tradeoff between power conversion efficiency ("PCE") and visible transparency ("VT"), since both parameters cannot be simultaneously optimized in conventional devices. Architectural adoption is impeded further with typical organic PVs that have non-uniform absorption within the visible spectrum, resulting in poor color rendering index ("CRI"), high colored tinting and poor natural lighting quality. In contrast, it would be desirable to obtain visibly transparent, UV/NIR-selective LSCs to avoid aesthetic tradeoffs (low VT or CRI) that hinder architectural adoption and provide a clear route to large area scaling.

Various conventional devices employ a luminescent solar collector having luminescent agents dispersed throughout. Exemplary U.S. patent Nos. include: U.S. Pat. No. 4,155,371 entitled "Luminescent Solar Collector" which issued to Wohlmut et al. on May 22, 1979; U.S. Pat. No. 4,159,212 entitled "Luminescent Solar Collector" which issued to Yerkes on Jun. 26, 1979; U.S. Pat. No. 4,357,486 entitled "Luminescent Solar Collector" which issued to Blieden et al. on Nov. 2, 1982; 2009/0027872 entitled "Luminescent Object Comprising Aligned Polymers having a Specific Pretilt Angle" which published to Debije et al. on Jan. 29, 2009; and 2010/0288352 entitled "Integrated Solar Cell Nanoarray Layers and Light Concentrating Device" which published to Ji et al. on Nov. 18, 2010. All of these are incorporated by reference herein.

SUMMARY

In accordance with the present invention, a transparent luminescent solar concentrator is provided. In another aspect, a luminescent solar concentrator absorbs outside of visible light (preferably 300-450 nm) and emits outside of visible light (preferably 650-2200 nm, more preferably greater than 670 nm, and most preferably centered at approximately near-infrared 800 nm). A further aspect of a luminescent solar concentrator employs nanocrystal clusters embedded in a polymeric matrix. In still another aspect, a unique ligand and luminophore host pairing is used for a solar concentrator. Moreover, a method of manufacturing a transparent luminescent solar concentrator is provided.

The present apparatus and method are advantageous over traditional devices. For example, the present luminescent solar concentrator is perfectly transparent to human vision, thereby making it ideally suited for use in viewing windows in a structural building, greenhouses, automotive vehicle, aircraft, watercraft or the like. Furthermore, the nanocrystal clusters of the present apparatus advantageously provide a massive Stoke-shift (for example, greater than 200 nm). Moreover, the ligand and host composition aspect of the present apparatus achieve a quantum yield greater than 25%. It is also noteworthy that the inorganic clusters employed with an aspect of the present apparatus are highly resistant to degradation over time.

To overcome prior disadvantages, the present low-cost, luminescent solar concentrator is highly transparent in the visible spectrum, and enables integration onto window and glazing systems in the building envelope. The excitonic character and structured absorption of molecular dyes will produce near-infrared ("NIR") LSC architectures that selectively harvest ultra-violet and NIR light by waveguiding deeper-NIR luminophore emission to high efficiency segmented solar cells, thereby reducing any visual impact and minimizing the amount of expensive solar material reguired. Specific luminophores that can harness the majority of near-infrared and ultraviolet ("UV") photons are ideally suited for these transparent systems. Accordingly, this apparatus optimizes transparent luminescent solar concentrators with system efficiencies >5%, average visible transmittance of >70%, and a color rendering index of >90 for widespread window deployment. These LSCs generate electricity from both direct and incident light, and enhance the low-light efficiency through solar concentration while maintaining window glass aesthetics and architectural design freedom.

The present apparatus and method enable unique transparent LSC architectures aimed at efficiently and selectively harvesting UV photons and NIR photons without disrupting the visible components or reguiring solar tracking. These LSCs present opportunities for highly transparent (non-tinted) solar-scavenging windows that can translate into improved building energy efficiency and lower cost solar harvesting systems beyond the building skin including energy scavenging electronics displays, autonomous smart-windows, visible-blind detectors, and coatings for improved UV response and protection of traditional solar installations.

The clearest paths to fully maximize the large-area scaling of the present devices is through embedded collectors or incorporation of high-quantum-yield massive-Stokes-shift-luminophores ("MSSL"), where the former is beneficial for greater power output at the expense of poorer cost scaling and the latter is the most effective means to the realization of low-cost scaling. These two avenues to produce NIR and UV selective LSC systems are used for highly transparent windows, respectively, that simultaneously take advantage of existing infrastructure (e.g., framing, glass, etc.) to dramatically improve the cost scaling of these LSC systems.

The present approach offers the highest potential aesthetic quality coupled with large-area scaling, longevity, and low levelized-energy cost. In general, the use of non-luminescent concentrating optics (Pythagoras) in these applications: (1) are bulky, minimizing the ability for building widespread integration and retrofitting, (2) limit the transmission to diffuse-only light that leads to low transparencies on the order of 20-30% that is unacceptable for widespread adoption, and (3) require solar tracking to maintain high efficiencies, adding substantial cost, weight, and footprint, or resulting in dramatic reductions in efficiency. The trade-off between efficiency and transparency/aesthetics has defined the underlying limitation of all semi-transparent solar cell structures made to-date. Color-tinted windows are acceptable in niche applications, but the vast majority of traditional windows have very high transmission and low tinting. By focusing on developing thin-film molecules for LSC architectures with selective absorption in UV and NIR part of the spectrum, the present apparatus has a distinct advantage in optimizing transparency, efficiency, scaling, and window aesthetics needed to make transparent solar windows highly adoptable. Additional features and advantages of the present invention can be found in the following description and claims, as well as in the appended figures.

BRIEF DESCRIPTION OF THE DRAWINGS

The drawings described herein are for illustrative purposes only of selected embodiments and not all possible implementations, and are not intended to limit the scope of the present disclosure.

DETAILED DESCRIPTION

The preferred embodiments of the present apparatus and manufacturing method are directed to an improved luminescent solar concentrator that incorporates a segmented solar array at a top and/or bottom surface (rather than an edge of the waveguide). With the solar array arranged closer to the luminescent dye, there are fewer losses due to reabsorbed light. Accordingly, this improved LSC allows for the use of dyes with larger Stokes shifts, resulting in increased efficiency and output for the solar cell.

Figure 4:
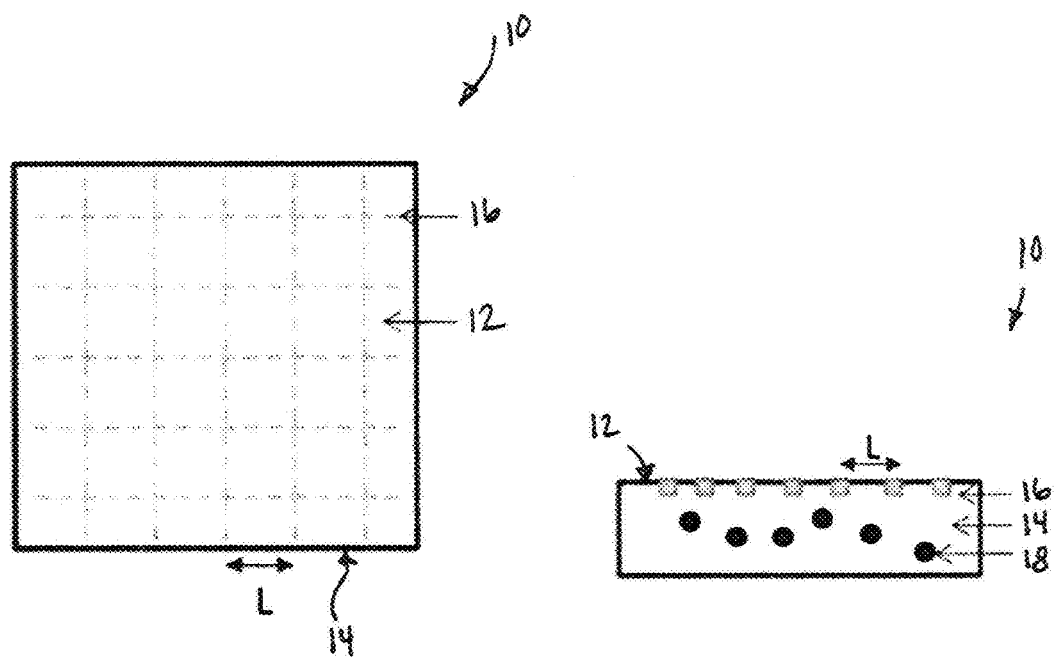
FIG. 4 is a schematic representation of a solar concentrator apparatus including a segmented inorganic solar cell positioned at the top or bottom of a waveguide in accordance with a principle of the present disclosure.

Referring to FIG. 4, a first embodiment of a solar concentrator apparatus 10 includes a segmented inorganic solar cell 12 positioned at the top or bottom of a waveguide 14. The solar cell 12 may have wires 16, microwires, nanowires, ribbons, or the like arranged within or placed on a surface of the waveguide 14 at a spacing L. The waveguide 14 comprises a transparent substrate, such as, glass, plastic, or poly(methyl methacrylate) (PMMA) having a VIS/NIR fluorescent or phosphorescent dye 18 formed therewith, such as through coating or spraying on the substrate or layering dyed sheets as strata between alternating stacks of the substrate. Advantageously, the proximity of the solar cell 12 to the dyes 18 allows a smaller Stoke-shift dye to be used, while still reducing thermal losses and improving overall system efficiency.

Figure 5:
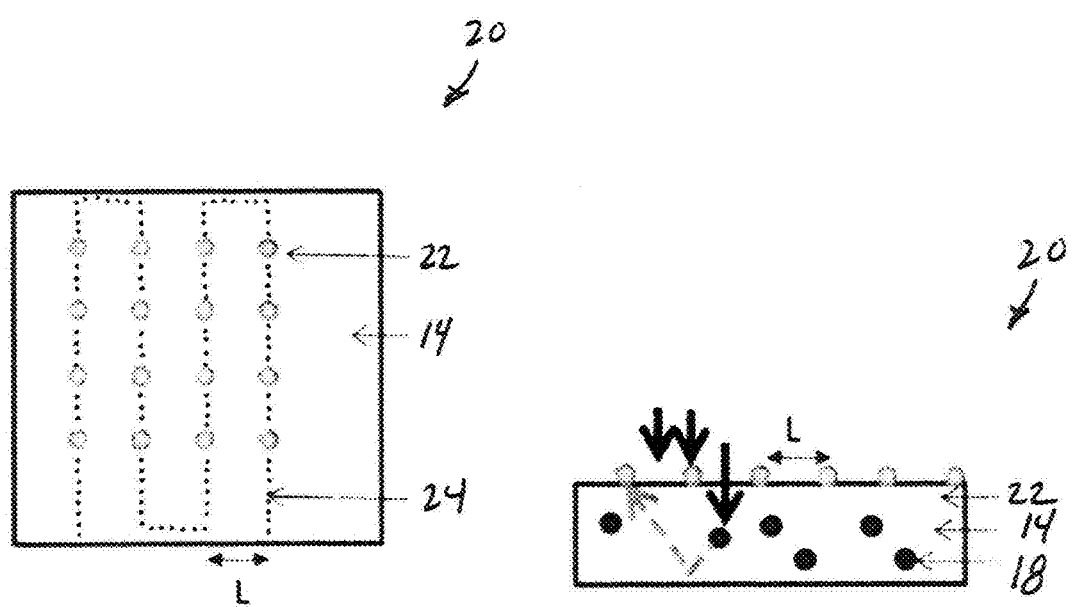
FIG. 5 is a schematic representation of a solar concentrator apparatus that may include spheres, dots, or a Si sphere solar array connected by thin-wire electrical connections in accordance with a principle of the present disclosure.

In a second embodiment as shown in FIG. 5, a solar concentrator apparatus 20 is substantially similar to that described with respect to the first embodiment; however, the solar cell may include, for example, spheres, dots, or a Si sphere solar array 22 connected by thin-wire electrical connections 24. Advantageously, using spherical or multisided solar cells further increases system efficiency as each cell can capture both direct and indirect sunlight at multiple angles.

Luminophores (dyes) 18 that harness the majority of near-infrared and ultraviolet photons are ideally suited for the present transparent systems. High-quantum yield, massive Stokes-shift luminophores 18 and embedded collectors are used to provide large-area scaling with highly efficient transparent LSCs. The individual luminophore performance is improved through combinations of chemical, purification, architecture, host-guest interactions and photon management with transparent NIR mirror design, and fabrication.

Transparent UV LSCs: Despite the lower overall fraction of the solar spectrum in the UV (~6%), there is significant potential in harvesting the UV in an LSC configuration of 1-2% system efficiency. UV emitters with large Stoke shifts and near-unity photoluminescence ("PL") yield employ UV-absorbing phosphor emitting beyond the visible range to avoid tinting from forward emitted luminescence and to eliminate reabsorption loss for larger area scaling.

Thus, synthesized metal halide phosphors are utilized that are perfectly aligned to absorb UV only (300-430 nm) while efficiently down-converting emitted light with a massive Stoke shift to the NIR (800 nm, peak), to make LSCs with >1.0% efficiency, color rendering index >95, and average transmission >80%. These materials are highly stable, highly luminescent, domestically abundant, and non-toxic.

Transparent NIR LSCs: A great fraction of the solar photon flux is in the NIR (~74%). This limitation is overcome by positioning highly-segmented, 50-100 µm wide, solar cell arrays commercially available and: (1) wired in parallel and in series, or (2) laser-patterned as meshes and embedded throughout the LSC waveguide, allowing for the use of smaller Stokes-shift NIR fluorophores.

Figure 2:
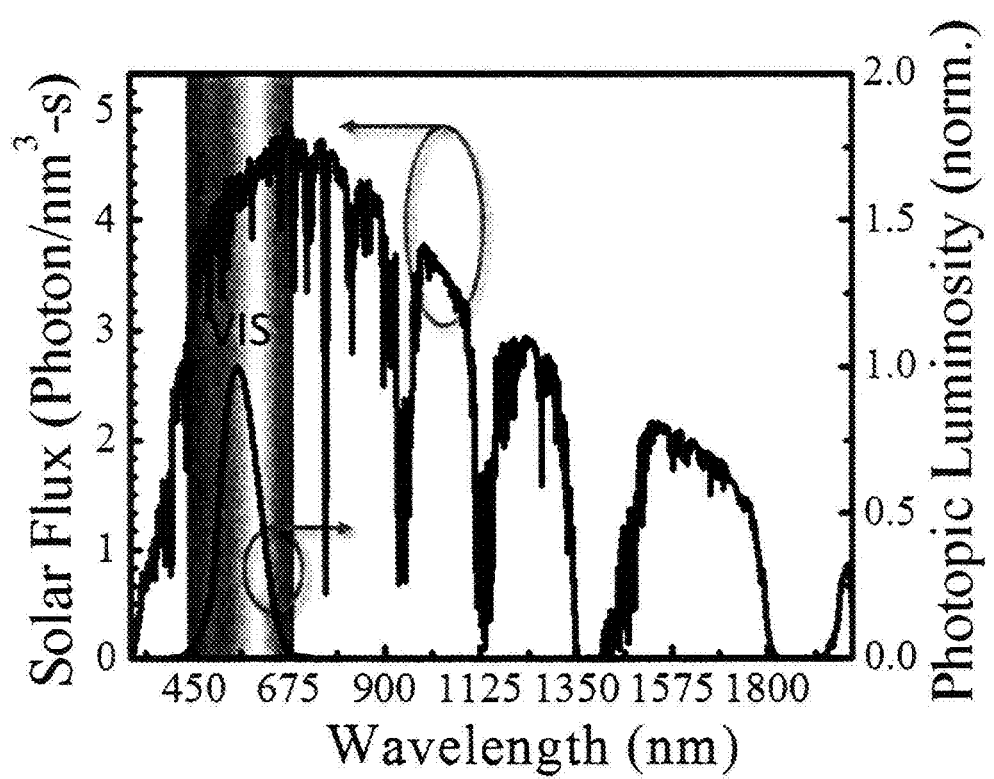
FIG. 2 illustrates the overlap of AM 1.5G solar flux and the photopic response, showing that about ⅓ of the photon flux is in the visible part of the spectrum with the remaining ⅔ of the flux in the infrared spectrum.

Building Lighting Efficacy and Color Rendering: Roughly 17% of all building electricity in the U.S. is used for lighting. Incentivizing solar window adoption can encourage architects to utilize more window space, increasing natural lighting, and reducing lighting costs. Reproducing the solar spectrum is the goal of most artificial lighting applications. Each solar window will impart a small modification to the spectrum transmitted. Thus, the color rendering index ("CRI") is used for evaluation by convoluting the transmission spectra with the solar spectrum (e.g., AM1.5G, etc.). The color rendering framework is useful for defining the visible part of the spectrum that should be transmitted and the components that can be utilized for power generation. For example, the 1931 CIE coordinate plots end at approximately 660 nm and 440 nm, with very little photopic response above and below these limits, respectively, defining the active spectral range to utilize as ≤440 nm and ≥660 nm. The photopic response is shown overlain with the solar spectrum in FIG. 2. While there is some response in the ranges from 380-440 nm and 660-720 nm, the response is particularly limited (<2% of the peak response) so that these wavelengths do not contribute significantly to the overall perception of color.

Figure 1:
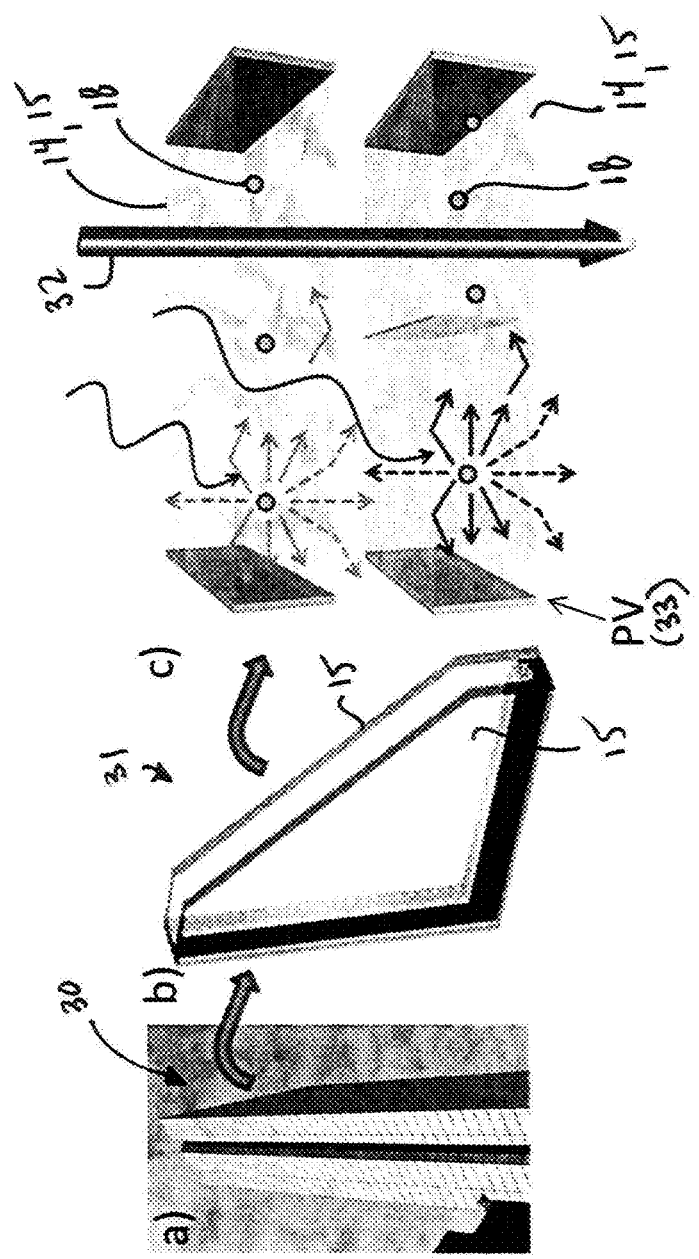
FIG. 1a depicts a building that may include a luminescent solar concentrator (LSC) in accordance with a principle of the present disclosure.
FIG. 1b depicts a window including a pair of window panes that may each include an LSC in accordance with a principle of the present disclosure.
FIG. 1c illustrates panes of the window illustrated in FIG. 1b, with each pane including luminophores and a photovoltaic that absorb light in accordance with a principle of the present disclosure.
Figure 6:
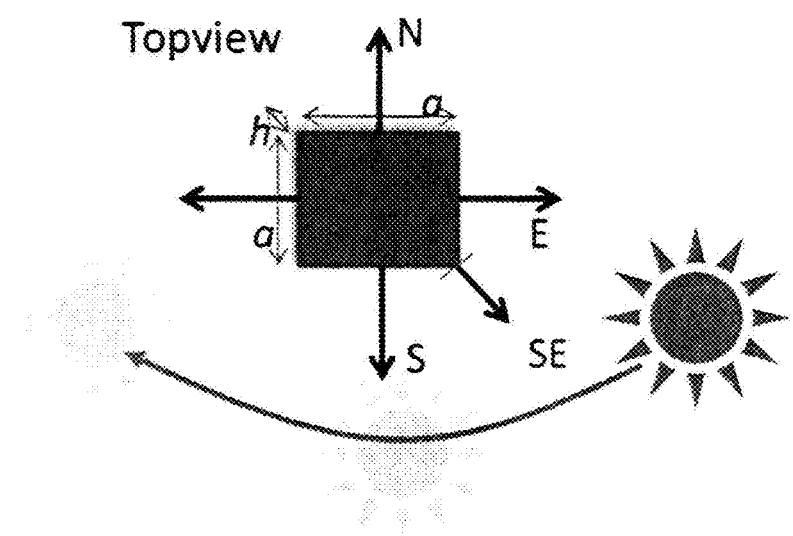
FIG. 6 is a schematic representation of the solar position relative to a building in the northern hemisphere with estimated sola flux densities.

Buildings as Collectors:

The present LSC can be used in creating three-dimensional structures, such as solar towers and obelisks to enhance solar collection. These structures can collect substantially more flux than solar tracking units of an eguivalent footprint. Likewise, buildings 30 (FIG. 1) can act as excellent solar collectors, collecting sunlight 32 effectively throughout the day on each face. For example, in FIG. 6 it is estimated that the total solar flux density from all four sides of a vertical building in Boston (9.3 kW-hr/vertical-m$^2$-day) is substantially more than for a solar tracking unit, even, of eguivalent footprint (6.0 kW-hr/horizontal-m$^2$-day), and even greater if we account for the total vertical area utilized in the building; while South-facing vertical windows will give the highest solar flux (and therefore power output), East-West facing windows extend the useful power production throughout the day. As best shown in FIG. 1, building 30 can include a plurality of windows 31 that may each include a pair of panes 15 of glass or some other material suitable as waveguide 14 including luminophores 18 dispersed therein. Between the panes 15 may be disposed a photovoltaic 33 for collecting charges formed through excitation of luminophores 18.

Cooling Considerations:

A significant fraction (~15%) of building electricity is utilized for air-conditioning. Conversion of electricity to heat is highly efficient (nearly 100%), while cooling efficiencies are significantly lower. The present LSCs, used as solar windows, can dramatically reduce unwanted solar heating from infrared flux by utilizing this energy for electricity generation and rejecting the rest from transparent, NIR-selective mirrors. The added benefit of utilizing this unwanted resource for electricity generation that could compliment or replace current low solar heat gain coefficient (SHGC) coating technologies. This heat-rejection functionally can enhance the effective LEC from direct power generation by 50-100%.

Figure 7:
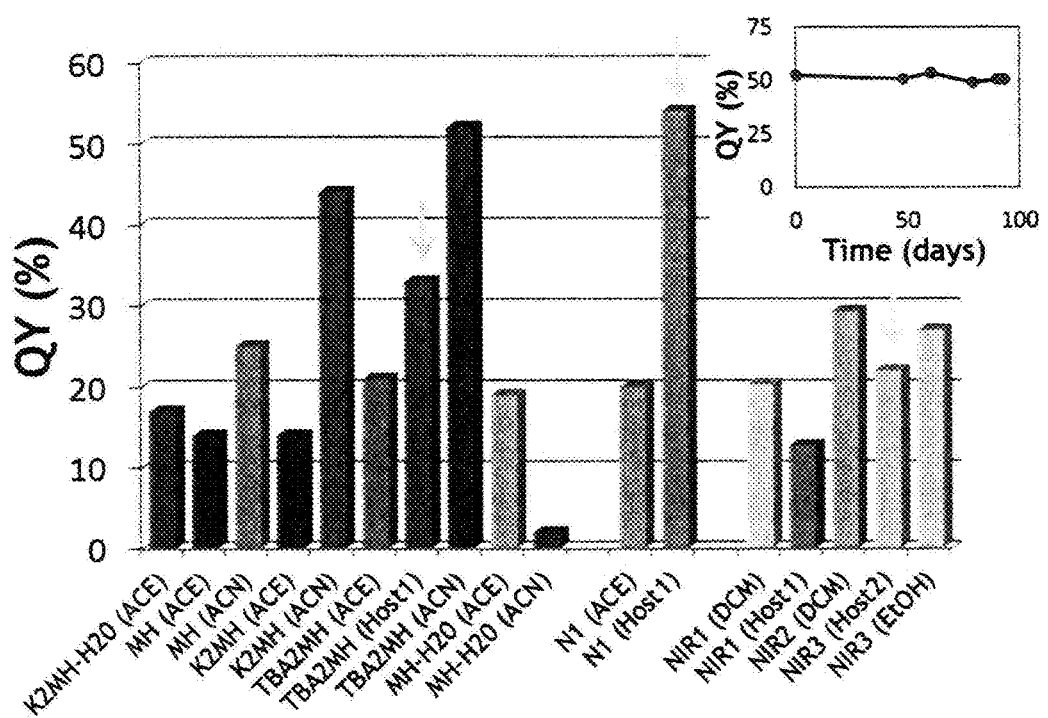
FIG. 7 illustrates a comparison of the measured quantum yields of UV and NIR absorbing luminophores in various states measured in a calibrated integrating sphere (inset)
Figure 8:
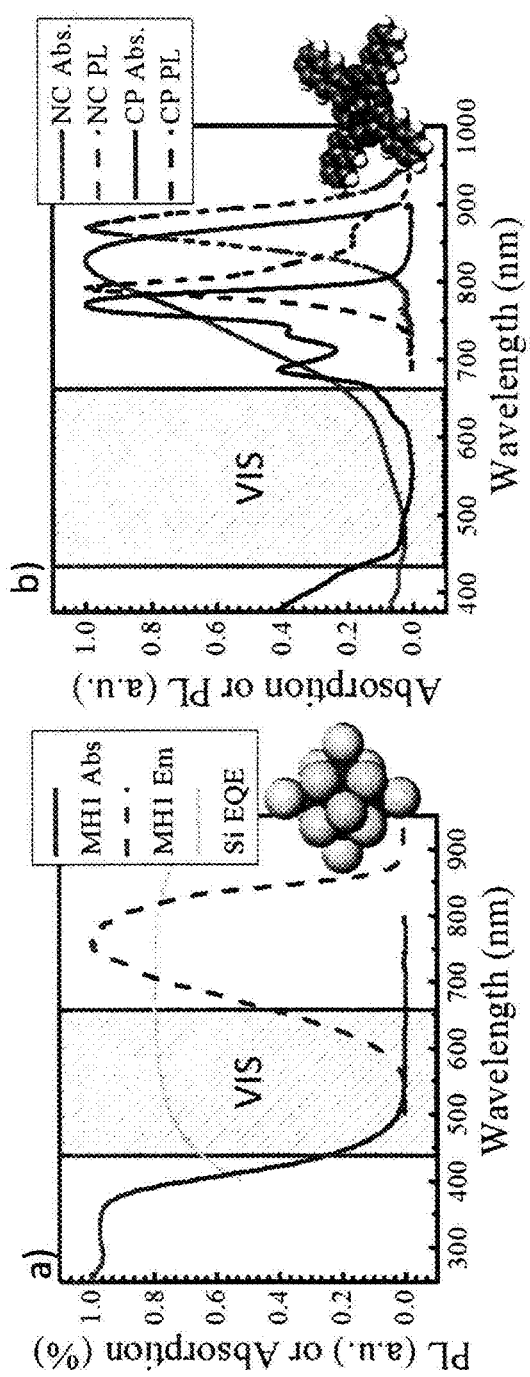
FIGS. 8a and 8b illustrate absorption and emission properties of UV and NIR, respectively, absorbing luminophores with quantum yields close to or greater than 50%.

Luminophores:

A range of luminophores are highlighted in FIG. 7. To efficiently capture and transform UV light, hexanuclear metal halide clusters $M(II)X_2$ such as nanoclusters of $MoCl_2$ (abbreviated MH in FIG. 7) are used. Here, their massive Stoke shift and perfect UV-VIS absorption cutoff features are exploited to reduce nearly all optical losses in the LSC configuration. Moreover, for particular ligand-host pairings, enhancements in the QY are obtained. For the NIR fluorophores, the focus is on derivatives of well-known dyes historically utilized in dye-lasers that have shown the highest relative stability including naphthalocyanine derivatives (i.e., analogous to the wavelength selective molecules we have previously exploited in transparent solar cells) and thiacarbocyanine salts with variable anion substitutability. FIGS. 8a and 8b illustrates absorption and emission properties of the UV and NIR absorbing luminophores with quantum yields close to or greater than 50%, which evidences that these materials are ideally suited for transparent integration into low cost LSCs for windows.

UV Cluster Variations:

Metal(II) halide clusters are modified from the parent salt compounds through ligand exchange reactions. The parent ion is usually synthesized through reduction of commercially available $M(V)X_5$, or purchased directly in the form of $M(II)X_2$. For Mo-based clusters, the parent compound is purified by conversion to the HCl salt, which is returned to $M(II)X_2$ or $M(II)X_{12}$ via heat-treatment under vacuum. Ligand exchange is carried out in a Soxhlet extractor or by direct reaction in acidic solutions in the presence of free cations, forming various complexes or salts respectively. The properties of a selected range of metal halide complexes synthesized here (hydrates, and salts) exhibit quantum yields >50% with only limited variable space explored. Many amine and thiol based ligands can be substituted around the terminal halides through thiolate and amine coordination. M, X, and L are varied in $MX_2.L_2$, $AMX_2.L_2$, $M_6X_{12}.L_2$, $A_2M_6X_{14}$, and $A_2M_6X_{14}.L_2$ including M=W, Mo and X=Cl, Br, I, and L=Cl, $CH_3CN$, benzenethiols, ethanethiols, $H_2O$ (hydrates), HCl, acetonitrile (CAN) and A=K, Na, tetrabutylammonium (TBA), and other ammonium salts. Moreover, amines and ammonium salts can be readily anchored to polymer chain backbones to enhance particle separation and increase quantum yields.

Optical Characterization:

Solution and film transmittance are measured with a dual-beam Lambda 800 UV/VIS spectrometer in transmission mode without a reference sample. Emission spectra and quantum yields for various nanoclusters are measured using a PTI QuantaMaster 40 spectrofluorometer with excitation at 325 nm under flowing high-purity nitrogen. Quantum yield measurements are made using a calibrated integrating sphere attachment.

Module Fabrication:

A polymer composite film is produced by mixing a 4 mg/ml $A_2M_6X_{14}$ acetonitrile solution with a 30 mg/ml (Poly)-ethyl methacrylate (PEMA) acetonitrile solution (Sigma-Aldrich) and PMMA derivative (Eukitt, Sigma-Aldrich) at a volume ratio of 1:2:1, to yield a target dye concentration of 1 mg/ml in the polymer composite film. The polymer composite film is drop casted on 2.5 cm×2.5 cm×0.1 cm substrates, comprising four edges, and allowed to dry for a several hours under flowing nitrogen, to result in a layer thickness of approximately 200 μm. On one edge, a laser-cut 2.5 cm×0.1 cm Si cell (Narec Solar) with an efficiency of 15+/−1% at 1 sun is attached with nearly-indexed matched epoxy. For EQE measurements, the remaining three edges are taped with black electrical tape to block edge reflection and to simplify the geometric configuration. For power efficiency measurements, two cells are edge-mounted on orthogonal edges and connected in parallel. Two remaining edges are covered with enhanced specular reflector (Vikuiti, 3M). A thin border area around LSC edges is masked to avoid any direct illumination of the solar cell. Due to the illumination area of the solar simulator (67005 Xe arc lamp, Newport), plate lengths are limited to <0.05 m.

Module Testing:

Position-dependent external quantum efficiency (EQE) measurements are obtained by directing a monochromatic excitation beam form a fiber perpendicular to the LSC at various distances (d) from a single edge-mounted Si PV. Measured quantum efficiency is corrected by factor $g=\pi/\tan^{-1}(L/2d)$, which accounts for a different angle subtended by the solar cell at each spot distance, where L is the length of the edge of the LSC. The EQE measurements are measured with a Newport calibrated Si detector. Current density versus voltage (J-V) measurements are performed under simulated AM1.5G solar illumination corrected for solar spectrum mismatch. A measured mismatch factor can be in the range of 1.0-1.1 so that an eguivalent intensity under testing can be 1.0-1.1 sun.

NIR Variations:

Thiacarbocyanine salts are one of several promising NIR materials in these LSC architectures. These materials can be tailored through their alkene length (di, tri, tetra, etc.) to vary the electronic band gap (emission range). For a given bandgap, the quantum yield of these materials will be directly tailored through anion modification ($Cl^-$, $I^-$, $ClO_4^-$, etc.) as shown in FIG. 7 for NIR1 and NIR2. Extended-conjugation molecule derivatives of naphthalocyanines can be employed to cover a significant portion of the NIR spectrum with high quantum yields.

Hosts:

The luminophore host is beneficial for: (1) physically separating molecules to increase quantum yields, (2) interacting directly and electronically with the molecules to increase or decrease quantum yields through polar interactions, and (3) encapsulating the chromophore to act as a barrier to air, moisture, and increase longevity. A PMMA derivative can, for example, enhance the quantum yield of several molecules from solution over a factor of two while allowing for negligible QY reduction over three months in air (see FIG. 7). Moreover, both sets of luminophores can be readily and directly anchored to amine polymers such as poly(4-vinylpyridine), and polymers with pendent ammonium salt chains, synthesized from amine polymers or through direct polymerization, respectively.

Substrates:

Because glass absorption also plays a role, highly transparent low iron glasses such as Saint Gobain Diamont, Planilux and Schott BF33, are preferred. They are the substrates of choice for commercial deployment over other polymer bases waveguides, which are rarely utilized as the base component in windows and exhibit particularly low absorption coefficients comparable to that of PMMA.

Solar Cells:

A range of solar cells can be utilized to reduce additional thermal losses. Cost and availability, however, will ultimately drive the cell design. For example, GaAs cells could boost the efficiency for $\eta_{SC}$ just over 30% compared to Si, particularly for the UV LSC, but the estimated costs for these cells are more than double or triple that of Si. For the cheapest 15-20% Si modules available, the monochromatic efficiency translates $\eta_{PV}$=22-24% for both the UV (emission at 800 nm) and NIR LSC (emission 900 nm) material sets. Accordingly, it is envisioned that LSC systems can be efficiently coupled with Si as cheaper higher bandgap cells (e.g., GaAs, and GaInP) become available.

Figure 9:
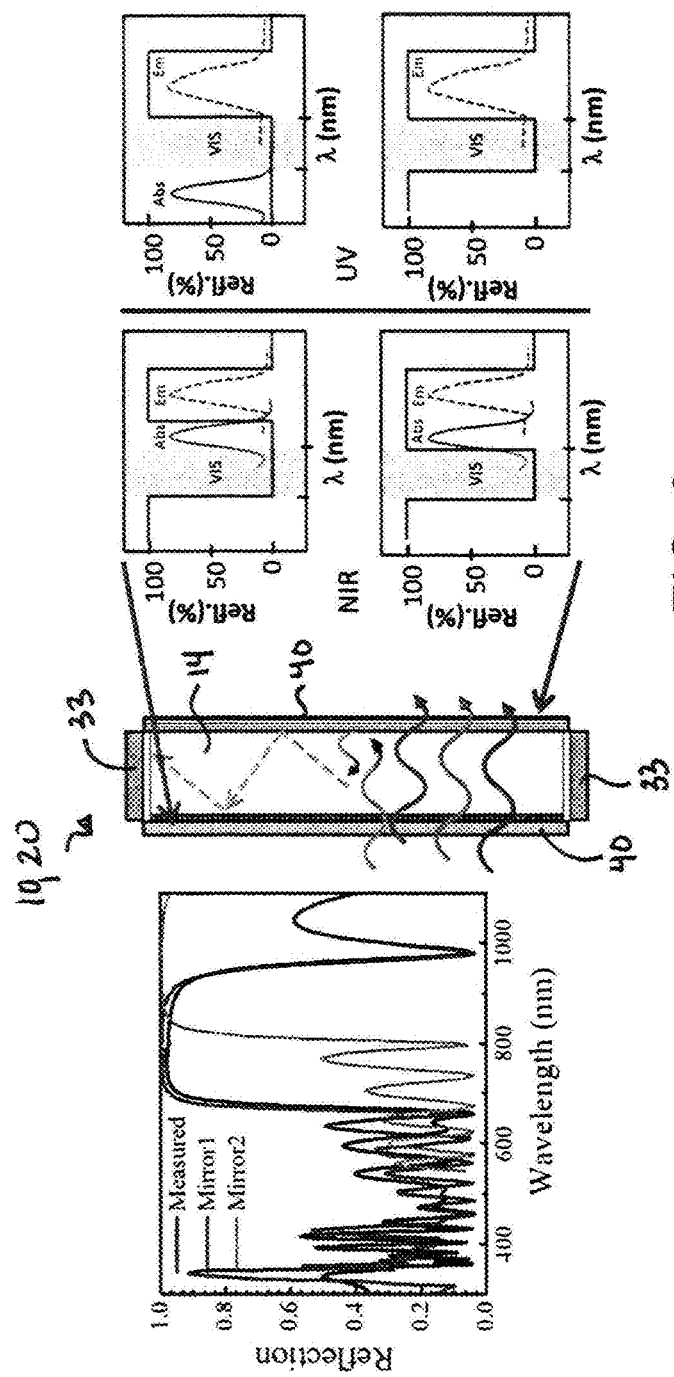
FIG. 9 illustrates measured and calculated reflection curves for an LSC including two transparent mirrors (shown schematically, middle) designed to accept short-wave NIR and trap longer-wave NIR emission.

Transparent Near-Infrared Mirrors:

Incorporation of visibly transparent, selective NIR reflectors 40 in transparent photovoltaics substantially improve power conversion efficiencies by 50-100%. Similarly, the incorporation of these coatings improves the optical efficiency at low plate dimension by >20% while reducing the quantity of dye needed by half for a given optical density, as illustrated in FIG. 4. For LSC sizes >0.5 $m^2$ these mirrors are helpful in mitigating any surface and bulk scattering imperfections that could reduce system efficiencies. Moreover, these coating layers are very similar to low-e-coatings that are already ubiquitously deployed and can complement or replace much of their functionality for heat rejection. Alternating layer combinations of $TiO_2$, $SiO_2$, and $Al_2O_3$ are grown by e-beam evaporation to optimize overall color impact and performance. FIG. 9 shows the mirror design for the UV-only and NIR-only LSCs.

Figure 10:
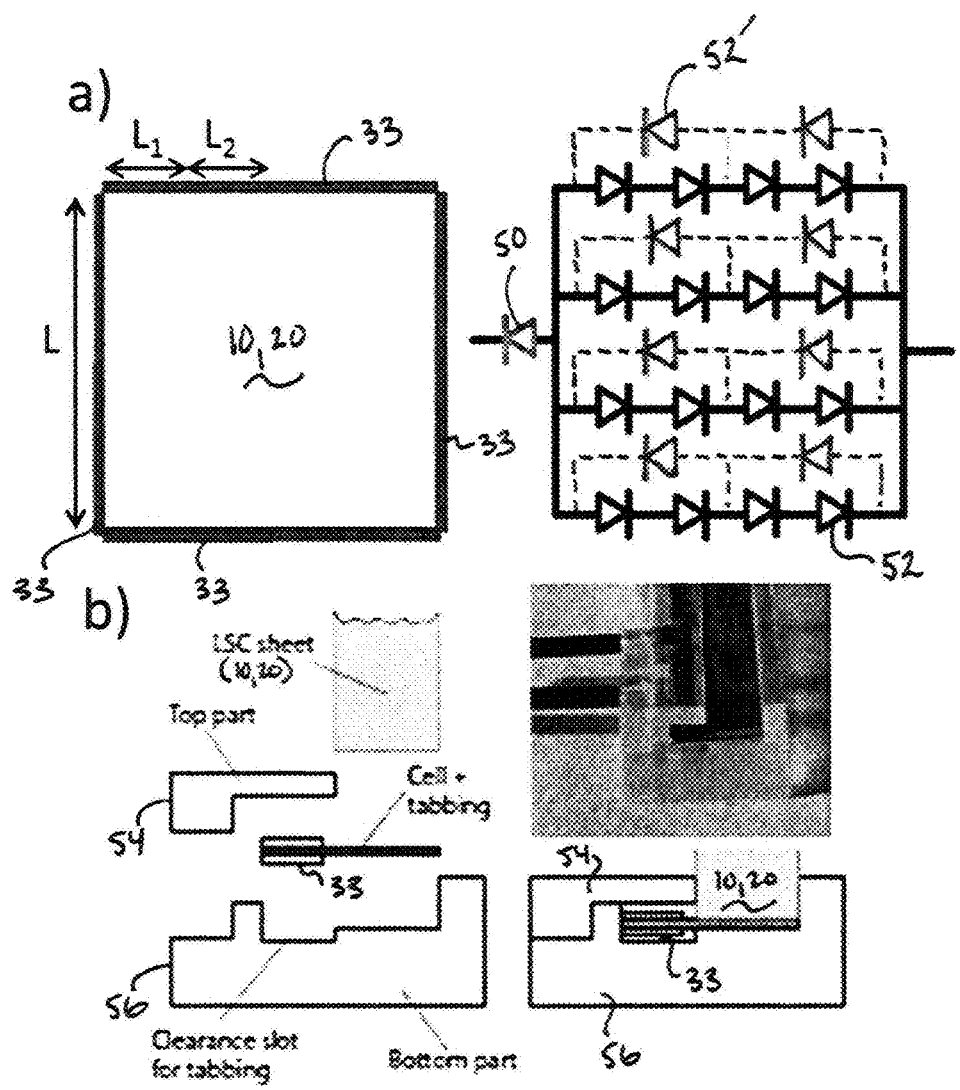
FIG. 10a illustrates a schematic of a photovoltaic configuration around an LSC including solar cells diodes, parallel diodes, and a blocking diode in accordance with a principle of the present disclosure.
FIG. 10b illustrates a jig that may be used to attach an LSC sheet to a solar cell in accordance with a principle of the present disclosure.

Edge-PV Configurations:

Si PVs 33 integrated around the LSC 10, 20 edge are attached and encapsulated using epoxies selected to provide index matching; individual cells will be wired to create anode-to-cathode interconnections between series-integrated individual cells and anode-to-anode or cathode-to-cathode interconnections between parallel-integrated cells. Generally, the series-integrated cells will result in an approximate summation of individual cell voltages, while parallel-integrated sub-cells will result in an approximate summation of individual cell current. As can be observed in FIG. 10a, full-scale modules incorporate blocking diodes 50 and parallel diodes 52 and 52' to prevent electrical buffering discharge and shading effects, respectively, where the diodes are integrated around the array periphery without a visual impact. FIG. 10b illustrates a jig including a top part 54 and a bottom part 56 that assists in connecting LSCs 10 or 20 to photovoltaic 33.

This system results in a new energy pathway to renewable, low-carbon solar-energy deployment that can overcome many of the social and economic challenges associated with traditional PV technologies while improving building efficiency. This is achieved with domestically abundant materials including carbon based molecules, and nanoclusters composed of Br, Cl, C, Mo, N, O, Si, W, phthalic, and naphthalic acid, and thiatricarbocyanine derivatives (i.e., notable industrial metals) and no rare earth, radioactive, or precious metals (e.g., Pt, Ir, etc.).

Figure 3:
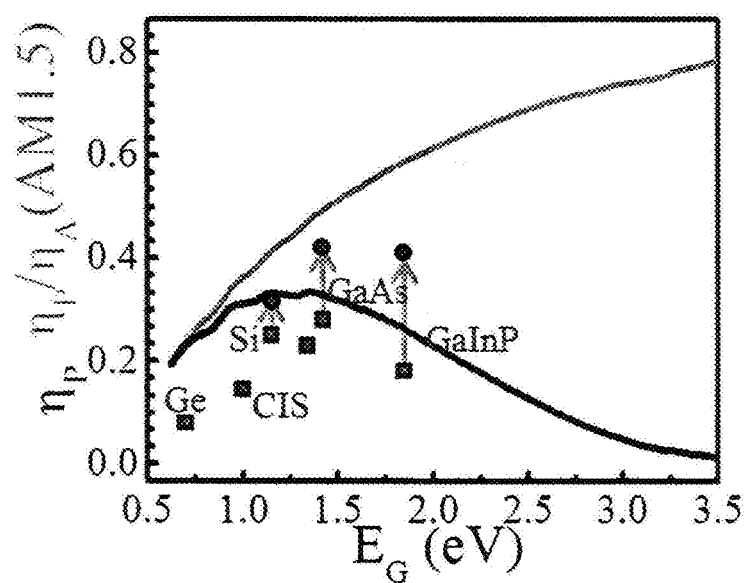
FIG. 3 is a plot of the AM 1.5G solar cell efficiency as a function of bandgap, and efficiency normalized by the AM 1.5 absorption efficiency.

Performance Modeling of Panel Scaling:

The efficiency of a luminescent solar concentrator can be defined as:

$$\eta_{LSC} = \eta_{PV}^* \cdot (1-R) \cdot \eta_{abs} \cdot \frac{\eta_{PL}\eta_{trap}(1-\eta_{RA})}{1-\eta_{RA}\eta_{PL}\eta_{trap}}$$

where R is the front face reflection, $\eta_{abs}$ is the solar spectrum absorption efficiency of the luminophore, $\eta_{PL}$ is the luminescence efficiency of the luminophore, $\eta_{trap}$ is the waveguiding efficiency of the light, and $\eta_{RA}$ is the probability of reabsorption. The light trapping efficiency is $\eta_{Trap}=\sqrt{1-1/n_{wav}^2}$. The PV efficiency (reported for AM1.5G) normalized by the solar spectrum absorption efficiency and the quantum efficiency at the luminophore wavelength is:

$$\eta_{PV}^* = \left(\frac{\eta_{PV}(AM\ 1.5\ G)}{\eta_A(AM\ 1.5\ G)}\right) \cdot \frac{\int \eta_{EQE}(\lambda)PL(\lambda)d\lambda}{\int PL(\lambda)d\lambda}$$

where $\eta_{EQE}$ is the external quantum efficiency, PL is the luminophore emission spectrum. The thermodynamic limiting $\eta_{PV}$ is shown in FIG. 3 where this scaled efficiency only accounts for Voc and FF losses. Because of the light dependence of $\eta_{PV}$, this correction will become dependent of the geometrical gain of the collector. For simplicity, it is assumed that the waveguided light flux remains close to 1-sun.

Figure 11:
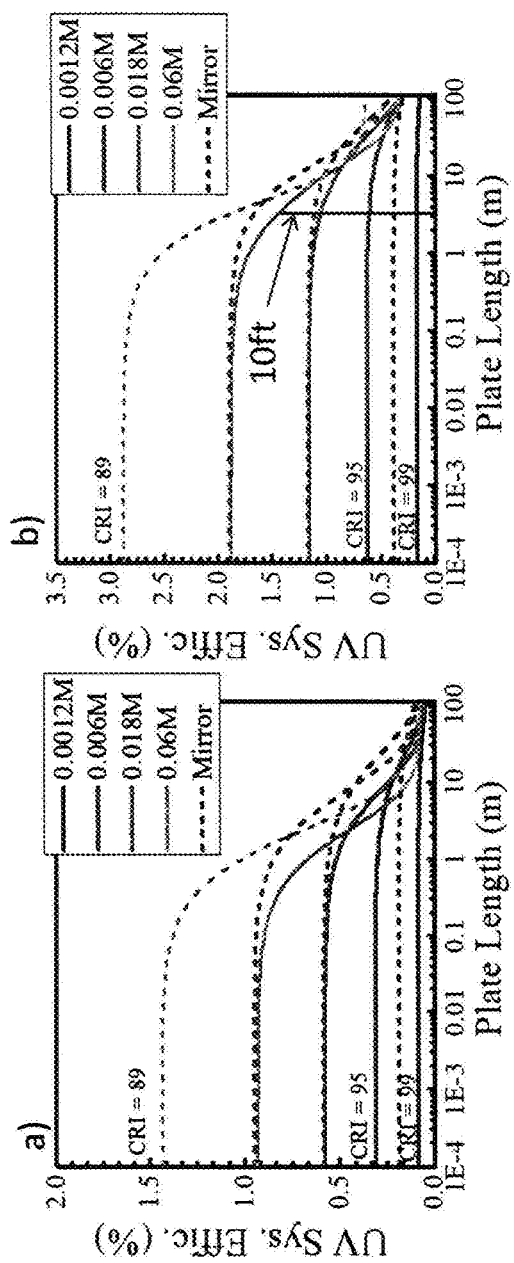
FIGS. 11a and 11b illustrate the overall calculated LSC system efficiency for the UV only concentrator utilizing the spectral properties of FIG. 8a, a silicon photovoltaic, a low-iron substrate with an index of 1.7, and quantum yields of 40% (FIG. 11a) and 80% (FIG. 11b) as a function of luminophore concentration embedded in a 50 µm thin host.
Figure 12:
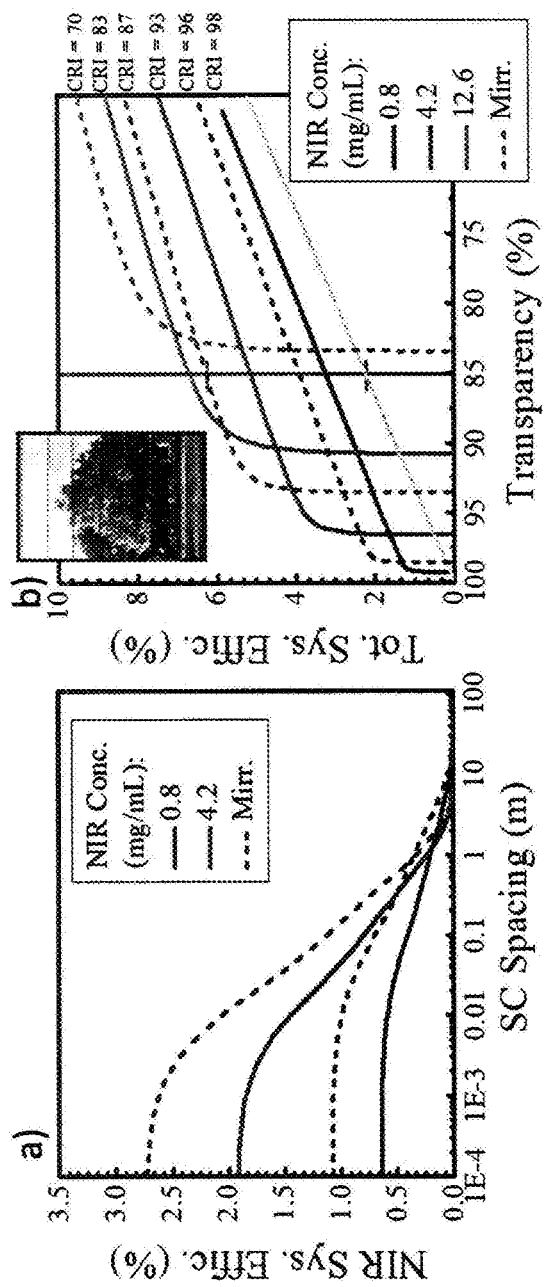
FIGS. 12a and 12b illustrate the overall calculated LSC system efficiency for an NIR-only concentrator (FIG. 12a) and an NIR-only concentrator combined with a spatially segmented 50 µm silicon solar cells (FIG. 12b) utilizing the spectral properties of FIG. 8b, a low-iron substrate with an index of 1.7, and quantum yields of 40% (FIG. 12a) and 80% (FIG. 12b) as a function of luminophore concentration embedded in a 50 µm thin host.

The reabsorption and forward emission losses can be estimated by:

$$\eta_{RA} = \frac{\int_0^\infty d\lambda \int_{\theta_{crit}}^{\pi/2} d\theta \int_{-\pi/4}^{-\pi/4} \sin(\theta)PL(\lambda)\left(1-\exp\left[-\varepsilon(\lambda)C\frac{Lt}{2t_0\sin(\theta)\cos(\phi)}\right]\right)d\phi}{\int_0^\infty d\lambda \int_{\theta_{crit}}^{\pi/2} d\theta \int_{-\pi/4}^{-\pi/4} \sin(\theta)PL(\lambda)\,d\phi}$$

where the critical angle (emission cone) is $\theta_{crit}=\sin^{-1}(1/n_{wave})$, $\varepsilon$ is the molar absorptivity, C is the concentration, L is the plate length, $\theta$ is azimuth relative to the normal of the LSC plane, and $\phi$ is the normal rotation coordinate. The results of numerically integrating this function to evaluate LSC system efficiencies for two of the representative LSC materials (UV Phosphor and NIR Luminophore) are shown in FIGS. 11 and 12. The impact of the massive Stokes-shift is highlighted in the optical efficiency for the UV and NIR scaling. At moderate phosphor loading, the UV LSC can retain efficiencies beyond 10 m, which is larger than most typical windows. In contrast for the NIR emitters, the efficiency begins to "roll-off" at only 1-10 cm, defining the ideal embedded solar cell spacing.

With the present NLSCs, the short Stoke-shift of the NIR harvesters is overcome through the solar cell implantation throughout waveguide layer, concomitantly reducing overall optical losses, increasing solar absorption efficiency, and also increasing the cost. Moreover, the combination of NIR LSC luminophores with segmented PVs enhances the efficiency output over three fold for a range of high-levels of transparency over segmented PVs alone. Nonetheless, NIR designs are utilized as a platform for applications requiring high-efficiency, and high-CRI. Ultimately, these cells will be implemented with embedded solar cell "meshes" or thin-wafers allowing for the combination of high performance, and ideal aesthetic quality.

Lifetime:

Decoupling of the luminophore layer from charge extraction (or generation) interaction leads to improved luminophore lifetimes, where polaron-exciton annihilation has been pinpointed as a significant degradation mechanism in electrically-drive light emitting devices. While the UV phosphors are sensitive to quenching by molecular oxygen, they show no measurable degradation even in the presence of oxygen. Moreover, these materials provide a good UV barrier, extending window and NIR component LSC lifetime. Adequate packaging techniques are further addressed through: (1) luminophore implantation in the protective waveguide, (2) further installation into double-paned sealed insulated glazing units (IGUs), the targeted deployment route, and (3) through multifunctional barrier/mirror layers.

With this technology, panel characteristics are quickly adapted through large input-variable space (e.g., dye concentration, waveguide thickness, mirror integration, window dimension, etc.) around any of these output parameters. As a result, the product performance can be tailored or customized to achieve the necessary combination of optical performance, power production and installed cost to match a variety of specifications for building designers looking to incorporate energy harvesting into the building skin. Additionally, this system is seamlessly integrated into the building's electrical system. The generated electricity can then be stored locally and used as direct-current power or inverted to AC to supplement the building grid, capable of supplying a sizable portion of a building's perimeter zone electricity needs at the point of utilization.

While various embodiments have been disclosed herein, it should be appreciated that other modifications may be made that are covered by the system and methods of the present invention. The description of the invention is merely exemplary in nature and, thus, variations that do not depart from the gist of the invention are intended to be within the scope of the invention. Such variations are not to be regarded as a departure from the spirit and scope of the present invention.

The invention claimed is:

1. A visibly transparent luminescent solar concentrator comprising:
   a transparent waveguide; and
   a transparent film including a plurality of visibly transparent luminophores disposed on the transparent waveguide, the luminophores operable to have a strongest peak absorbance of light in the ultraviolet spectrum between 300 nm and 450 nm and a strongest peak emission of light in the near-infrared spectrum between 650 nm and 2200 nm,
   wherein the luminophores have a structure selected from the group consisting of $MX_2.L_2$, $AMX_2.L_2$, $M_6X_{12}.L_2$, $A_2M_6X_{14}$, and $A_2M_6X_{14}.L_2$, where M=W or Mo, X=Cl, Br, or I, L=Cl, $CH_3CN$, benzenethiol, ethanethiol, $H_2O$, HCl, or acetonitrile, and A=a cation of K, Na, or tetrabutylammonium (TBA), wherein the entire visibly transparent luminescent solar concentrator has an average visible transmittance of greater than 70% and a color rendering index of greater than 70 at normal incidence to the transparent waveguide.

2. The concentrator of claim 1, wherein the luminophores have a Stokes shift of greater than 200 nm.

3. The concentrator of claim 1, wherein the concentrator exhibits a color rendering index greater than 90.

4. The concentrator of claim 1, wherein the waveguide is formed from glass.

5. A window comprising the concentrator of claim 4.

6. A building comprising the window of claim 5.

7. A visibly transparent luminescent solar concentrator comprising:
- a transparent waveguide; and
- a transparent film including a plurality of visibly transparent luminophores disposed on the transparent waveguide, the luminophores operable to have a strongest peak absorbance of light in the ultraviolet spectrum and a strongest peak emission of light in the near-infrared spectrum,
- wherein the visibly transparent luminophores have a structure selected from the group consisting of $MX_2.L_2$, $AMX_2.L_2$, $M_6X_{12}.L_2$, $A_2M_6X_{14}$, and $A_2M_6X_{14}.L_2$, where M=W or Mo, X=Cl, Br, or I, L=Cl, $CH_3CN$, benzenethiol, ethanethiol, $H_2O$, HCl, or acetonitrile, and A=a cation of K, Na, or tetrabutylammonium (TBA),
- wherein the entire visibly transparent luminescent solar concentrator has an average visible transmittance of greater than 70% and a color rendering index of greater than 70 at normal incidence to the transparent waveguide.

8. The concentrator of claim 7, further comprising at least one transparent near-infrared mirror.

9. A window, comprising:
- a glass panel including a first transparent film; and
- wherein the transparent film includes a plurality of visibly transparent luminophores, the visibly transparent luminophores operable to have a strongest peak absorbance of light in the ultraviolet spectrum and a strongest peak emission of light in the near-infrared spectrum,
- wherein the visibly transparent luminophores have a structure selected from the group consisting of $MX_2.L_2$, $AMX_2.L_2$, $M_6X_{12}.L_2$, $A_2M_6X_{14}$, and $A_2M_6X_{14}.L_2$, where M=W or Mo, X=Cl, Br, or I, L=Cl, $CH_3CN$, benzenethiol, ethanethiol, $H_2O$, HCl, or acetonitrile, and A=a cation of K, Na, or tetrabutylammonium (TBA),
- wherein the entire window has an average visible transmittance of greater than 70% and a color rendering index of greater than 70 at normal incidence to the window.

10. A visibly transparent luminescent solar concentrator comprising:
- a transparent waveguide; and
- a plurality of visibly transparent luminophores disposed within the transparent waveguide, the visibly transparent luminophores operable to have a strongest peak absorbance of light in the ultraviolet spectrum and a strongest peak emission of light in the near-infrared spectrum, and having a structure selected from the group consisting of $MX_2.L_2$, $AMX_2.L_2$, $M_6X_{12}.L_2$, $A_2M_6X_{14}$, and $A_2M_6X_{14}.L_2$, where M=W or Mo, X=Cl, Br, or I, L=Cl, $CH_3CN$, benzenethiol, ethanethiol, $H_2O$, HCl, or acetonitrile, and A=a cation of K, Na, or tetrabutylammonium (TBA),
- wherein the entire visibly transparent luminescent solar concentrator has an average visible transmittance of greater than 70% and a color rendering index of greater than 70 at normal incidence to the transparent waveguide.

11. The visibly transparent concentrator of claim 10, wherein the color rendering index is greater than 90.

12. The visibly transparent luminescent solar concentrator of claim 10, wherein the visibly transparent luminescent solar concentrator is non-tinted.

13. The visibly transparent luminescent solar concentrator of claim 10, wherein the visibly transparent luminescent solar concentrator has a quantum yield of greater than 25%.

14. The visibly transparent luminescent solar concentrator of claim 10, wherein the visibly transparent luminophores have a Stokes shift of greater than 200 nm.

15. The visibly transparent luminescent solar concentrator of claim 10, wherein the strongest peak absorbance of light in the ultraviolet spectrum is between 300 nm and 450 nm and the strongest peak emission of light in the near-infrared spectrum is between 650 nm and 2200 nm.

16. The visibly transparent luminescent solar concentrator of claim 10, wherein the visibly transparent luminescent solar concentrator comprises an edge-mounted solar cell or a solar array embedded within the waveguide and has a power conversion efficiency of greater than 0.1% and less than 10%.

17. The visibly transparent luminescent solar concentrator of claim 16, wherein the visibly transparent luminescent solar concentrator has an area of greater than 0.5 $m^2$.

18. A window comprising the visibly transparent luminescent solar concentrator according to claim 10.

* * * * *